United States Patent [19]
Duffy et al.

[11] Patent Number: 5,876,842
[45] Date of Patent: Mar. 2, 1999

[54] MODULAR CIRCUIT PACKAGE HAVING VERTICALLY ALIGNED POWER AND SIGNAL CORES

[75] Inventors: Thomas Patrick Duffy, Endicott; Harold Kohn; Voya Rista Markovich, both of Endwell; David John Russell, Apalachin, all of N.Y.

[73] Assignee: International Business Machines Corporation, Armonk, N.Y.

[21] Appl. No.: 774,849

[22] Filed: Dec. 27, 1996

Related U.S. Application Data

[63] Continuation of Ser. No. 486,222, Jun. 7, 1995, abandoned.

[51] Int. Cl.$^6$ .......................................................... B32B 9/00
[52] U.S. Cl. .......................... 428/209; 174/250; 174/256; 174/258; 174/261; 174/262; 361/792; 361/795; 361/736; 428/901
[58] Field of Search ..................................... 428/209, 901; 174/250, 256, 258, 261, 260; 361/792, 795, 736

[56] References Cited

U.S. PATENT DOCUMENTS

| | | | |
|---|---|---|---|
| 3,760,091 | 9/1973 | Cannizzaro et al. | 174/68.5 |
| 4,464,704 | 8/1984 | Huie et al. | 174/68.5 |
| 4,774,632 | 9/1988 | Neugebauer | 361/386 |
| 4,783,815 | 11/1988 | Buttner | 29/852 |
| 4,915,983 | 4/1990 | Lake et al. | 427/98 |
| 5,031,308 | 7/1991 | Yamashita et al. | 29/830 |
| 5,081,563 | 1/1992 | Feng et al. | 361/414 |
| 5,128,831 | 7/1992 | Fox, III et al. | 361/396 |
| 5,129,142 | 7/1992 | Bindra et al. | 29/852 |
| 5,142,775 | 9/1992 | Wiley | 29/856 |
| 5,232,548 | 8/1993 | Ehrenberg | 216/18 |
| 5,316,787 | 5/1994 | Frankeny | 427/97 |
| 5,768,108 | 6/1998 | Miura et al. | 174/256 |

FOREIGN PATENT DOCUMENTS

| | | |
|---|---|---|
| 3728151 | 3/1989 | Germany. |
| 3272194 | 3/1991 | Japan. |

OTHER PUBLICATIONS

"PC Board Construction Method"; IBM Technical Disclosure Bulletin; vol. 29, No. 9, Feb. 1987; K. Hermann and J.P. Koons; pp. 4149–4151.

Websters II, New Riverside Dictionary, pp. 678, 1063.

Webster's New Riverside Dictionary, 3rd Ed. p. 465.

Harper, electronic Packaging Microelectronics and Interconnection Dictionary, p. 71.

Coombs, Printed Circuits Handbook, 3rd ed. 1988, pp. 11.18,11.19,31.3,31.4–31.7, 34.1–34.3, G. 3.

*Primary Examiner*—William Krynski
*Assistant Examiner*—Cathy F. Lam
*Attorney, Agent, or Firm*—Whitham, Curtis & Whitham; John R. Pivnichny, Esq.

[57] ABSTRACT

A modular structure for providing electrical interconnections achieves greatly increased wiring density by forming vias and wiring patterns by chemical (e.g. lithographic) processes rather than by mechanical processes such as punching of vias and screening patterns of conductive paste. A basic module is a power core comprising an apertured metallic foil with an insulator applied to surfaces thereof, extending through at least one aperture and exposing the metallic foil in at least one aperture. The foil in the power core provides stiffness to facilitate subsequent handling and electrical shielding between conductive layers as well as a potential power connection. Via connections of increased conductivity and robustness are formed by plating the interior of vias after lamination of a desired combination of power cores and signal cores. Vias remain unfilled until after lamination and are available to facilitate optical alignment of composite layers including signal cores, power cores and laminated combinations thereof.

29 Claims, 6 Drawing Sheets

MODULAR CIRCUIT PACKAGE HAVING VERTICALLY ALIGNED POWER AND SIGNAL CORES

This application is a continuation of U.S. patent application Ser. No. 08/486,222, filed Jun. 7, 1995 and now abandoned.

BACKGROUND OF THE INVENTION

1. Field of the Invention

The present invention generally relates to the fabrication of modular electronic circuit packages and, more particularly, to electronic circuit packages having multi-layer electrical interconnection patterns and which are capable of providing signal and power connections to one or more integrated circuit chips and/or interconnecting a plurality of integrated circuit chips.

2. Description of the Prior Art

The trend toward fabrication of electronic circuit devices at smaller sizes and higher integration densities is principally due to the higher circuit performance which is generally associated with reduced size and interconnection distances. Reduction in size of electronic circuits is often accompanied by reduced parasitic capacitances, shortened signal propagation times and reduced power dissipation. Additionally, the process cost is generally reduced with the size of a circuit of a given design complexity since such size reduction allows more such circuits to be formed on a single semiconductor wafer of a given size or through the use of equipment of a fixed processing capacity. Therefore process costs can be projected over a larger number of devices even though some process complexities and costs may be increased as feature sizes in the integrated circuit design approach the limits reliably available at any given time.

To fully exploit the performance improvements available from reduced propagation time as well as reduced costs deriving from increased integration density, chip interconnection systems must be able to mechanically support a potentially large plurality of integrated circuit chips in close proximity and provide potentially complex electrical interconnection thereof at relatively low cost and with high reliability. Such interconnection systems often cannot be provided as an incident of circuit integration on a single chip since incompatible processes are often required to form optimal integrated circuits having different functions. Accordingly, to meet the need for interconnection of a potentially large plurality of integrated circuit chips, so-called multi-layer modules (MLM's) have been developed which include a plurality of lamina having desired circuit interconnection patterns formed thereon. These lamina, which may be of a variety of materials such as ceramic or polymers (e.g. polyimide) are then stacked and formed into a single body by heat treatment such as sintering for ceramics or fusing for polymers.

Connections between conductive patterns formed on respective lamina of MLM's is achieved by the formation of vias (e.g. generally by punching or drilling) which are essentially perforations in the respective lamina which are later filled with a conductive material such as metal or a conductive paste such as that used to form the conductive patterns. Often, conductive spheres or cylinders will be embedded into the lamina to form vias with a reduced number of process steps. Preferred methods of via formation are not consistent for all materials of which the lamina may be made; requiring different machinery and process steps for different lamina and via materials.

The completion of vias in each lamina before the lamina are joined together, however, implies a requirement that the process for joining the lamina must also form good electrical connections at the via locations in one lamina to the conductive pattern on an adjacent lamina. This process, though presently well-developed and highly reliable generally causes residual stress in the lamina and the completed MLM. Additional stresses may occur during lamination or curing of the lamina, as well, with the result that there will generally be some dimensional distortion of the lamina during the process which may compromise alignment. Such stress is partially borne by the via connections and may be relieved during thermal cycling or other mechanisms after the MLM is placed in service with the result that via connections may become less reliable as stress is relieved.

Further, process tolerance for forming the via connections within the body of the MLM is relatively critical and inherently does not result in a structure of optimal robustness. It should also be recognized that the number of vias in each lamina may be in the thousands and the number of connections which are simultaneously formed is therefore many times larger and will increase as the number of lamina and or the number of vias per lamina required by the MLM design increases. Therefore, the possibility of the improper or less than ideal formation of one or more connections in the MLM greatly increases and robustness is compromised with increased complexity of the MLM design.

Additionally, it should be recognized that the process for forming MLM's in this way is expensive and complex; requiring numerous steps to be carried out with high precision, particularly as to positional registration as the lamina are stacked. Automated optical alignment cannot generally be accomplished without the formation of a plurality of transparent features or apertures which would occupy module space and further complicate manufacturing processes. Further, the formation of vias by punching or drilling carries the possibility of contamination of the lamina with the material removed from the vias. Punching and drilling processes usually must be performed serially (e.g. one via after another) and, even when carried out at high speed, the number of vias inherently extends the time required for the formation of vias in each lamina.

Sequential drilling and punching also allows the possibility of individual, relative, positional errors and via malformations such as may occur through so-called "wandering" of a drill bit as a hole is begun or through mechanical recoil or bounce of a punch. Correct formation of the via apertures and the filling thereof must also be verified by serial inspection or testing (e.g. optical inspection) of each via before and after filling. Therefore, punching and drilling processes and the inspection or testing processes required for verification of via formation and filling are inherently expensive since costly, high-precision machines are required for an extended period of time for each lamina and the cost of such machinery and its maintenance must be amortized over the number of devices produced, increasing the production cost of such devices.

Also, since the lamina are worked individually, while vias are formed, the potential for variation from uniformity is substantial and substantially exact repeatability is not assured. Filling of the vias is also difficult and less than fully reliable; often requiring inspection of each via in each lamina prior to lamination by stacking and joining.

As an additional complication, the electrical requirements for power and signal connections are very different. Signal connections require very little current to be carried and parasitic capacitances are relatively critical to the propagation of signals having significant voltage swings. Power connections, however, must carry substantial current but the current may vary widely while voltage variation must be kept to a minimum. Heat dissipation may also be an important consideration in the design of power connections. For this reason, power and signal connections are generally formed on different lamina of a multi-layer interconnection structure.

However, the use of different layers or lamina for different types of connections necessarily implies that some connections must pass through other layers or lamina by the use of vias. Short signal paths also generally implies that signal connection lamina and power connection lamina should be grouped together toward opposite sides of the multi-layer interconnections structure (i.e. the signal layers grouped near the top where integrated circuits are to be attached and power layers grouped in lower layers. The use of vias for interlayer connections also implies a substantial uniformity of conductor structures which must be used to meet the differing requirements of power and signal connections which are usually optimized in design for signals and a large plurality of vias used for power connections. For example, it is not unusual for 25% or more of the connections to integrated circuit chips to be dedicated to power connections and a similar fraction of available vias may be used for power connections in interconnection modules, as well. In fact, a higher percentage of vias may be required because of the relatively greater length of power connections through vias when power connection layers are grouped in the lower layers of a module. The number of power connections may also restrict design flexibility in regard to the number and location of vias available for signal connections. Due to the possibility of ohmic heating of power connections, circuitous connections through the MLM are undesirable and vias used for power connections are often formed by a group of adjacent vias of significant extent.

In practical effect, the combination of problems encountered in known multi-layer interconnection structures requires that wiring density be limited to a lower density than that which can be achieved at the present state of the art. For example, vias must be made larger and spacing between conductors must be increased to accommodate slight misregistration between lamina in order to achieve acceptable manufacturing yields. This limitation on wiring density also limits reduction of size and, hence, some performance parameters of electronic modules as well as limiting the economy with which such modules may be produced.

SUMMARY OF THE INVENTION

It is therefore an object of the present invention to provide a structure for supporting and providing electrical connections to one or more integrated circuit chips as well as connections therebetween which may be produced by a reduced number of relatively inexpensive process steps which are applicable to virtually any material suitable for fabrication of modular interconnect structures.

It is another object of the invention to provide a structure for supporting and providing electrical connections to one or more integrated circuit chips as well as connections therebetween which is of high mechanical robustness.

It is a further object of the invention to provide a structure for supporting and providing electrical connections to one or more integrated circuit chips as well as connections therebetween in which mechanical robustness and manufacturing yield are not compromised by design complexity.

It is yet another object of the invention to provide a manufacturing process of greatly reduced cost and high repeatability with high product uniformity which results in an interconnection structure of increased robustness and reliability.

In order to accomplish these and other objects of the invention, a structure is provided for inclusion in a multi-layer electrical interconnection structure including a metallic foil having apertures formed therein, and an insulator formed on surfaces of the metallic foil, exposing the metallic foil within at least one of the apertures in the metallic foil.

In accordance with another aspect of the invention, an electrical interconnection structure is provided including at least one signal core comprising a metallic foil having apertures formed therein, an insulator formed on surfaces of the metallic foil, exposing the metallic foil within at least one apertures and extending through at least one apertures in the metallic foil, and a pattern of conductive material formed on the insulator and extending through at least one aperture.

In accordance with a further aspect of the invention, a method of making an electrical interconnection structure is provided including the steps of forming apertures in a metallic foil, and applying an insulator on surfaces of the metallic foil extending through at least one aperture in the metallic foil and exposing the metallic foil within at least one aperture in the metallic foil.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
FIGS. 1A, 1B, 1C, 1D and 1E are a sequence of cross-sectional views illustrating the formation of a 2S/1P core in accordance with the invention.

Referring now to the drawings, and more particularly to FIG. 1a, there is shown, in cross-section, a metallic foil sheet (e.g. copper) 10 which is used as a starting point for construction of a subassembly of the modular interconnection structure in accordance with the invention. (While the invention will be disclosed in connection with the fabrication of modular circuit packages, which is the preferred and evidently most advantageous application thereof at the present time, it is to be understood that the principles of the invention are applicable to any type of layered modular interconnection structure such as printed circuit boards, flexible wiring substrates with or without component mounting provisions and single chip integrated circuit packages as well as the highly complex modular circuitry which may provide for mounting and interconnection of hundreds of separate integrated circuit chips in a single package.)

The metallic foil sheet is preferably of a thickness which provides sufficient stiffness and dimensional stability to reduce the difficulty of handling of the structure at various stages of production. This sheet may also be used to form a power connection in the completed structure. Such a metallic foil sheet can provide ample cross-sectional area for substantial currents and, whether or not current is carried thereby, some shielding effect will be provided between connection patterns which will be developed, as will be described below.

The thickness of the foil should be chosen in view of the anticipated currents to be carried, if any, as will be understood by those skilled in the art in light of this disclosure but any thickness adequate to withstand patterning by known processes and to provide sufficient stiffness to facilitate handling will usually be sufficient for currents encountered in modular circuits of current design complexity and number of attached integrated circuit chips.

Figure 1B:
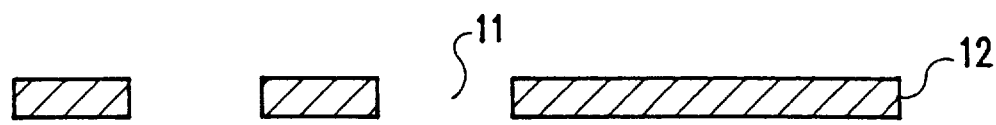
Figure 1C:
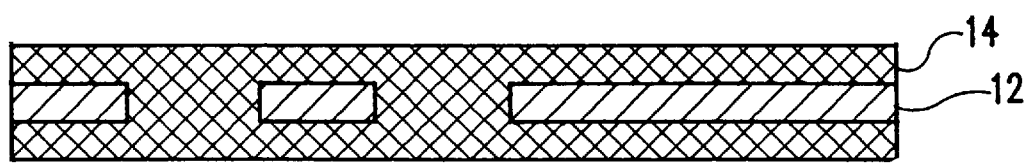

As shown in FIG. 1b, this metallic foil sheet 10 is then patterned by any known technique (e.g. lithographically) to form apertures 11 therein wherever vias are desired. Then, as shown in FIG. 1c, the patterned foil sheet 12 is laminated with a dielectric material 14 which is patternable either by being later coated with a patternable resist or by being of a material such as a photosensitive polyimide which is, itself, sensitive to radiation energy (e.g. light, X-rays, electron beam, etc.) to make selected areas thereof removable by development or etching and other known processes (e.g. lithographically). After suitable exposure in similar via areas (but of smaller transverse dimension (e.g. diameter) except where power connections are to be made) and development with further etching, if necessary, the patterned foil 12 will be encapsulated in the dielectric material 14 as shown in FIG. 1d.

It should be noted that this structure forms the central region of a basic module which will hereinafter be referred to as a signal core. However, as will be more fully discussed below, this structure, itself, and as depicted in FIG. 1d, is advantageously used as a lamina of the circuit module in accordance with the invention for the purpose of power connections or shielding and will be sometimes referred to as a power core. That is, as a matter of nomenclature, the structure of FIG. 1d constitutes a power core whether or not additional connections are formed thereon to form a structure which will be sometimes referred to hereinafter as a signal core. In either case, the metal foil need not carry power but may merely provide shielding between signal connection layers formed thereon or on other power or signal cores in the manner which will now be described.

Figure 1D:
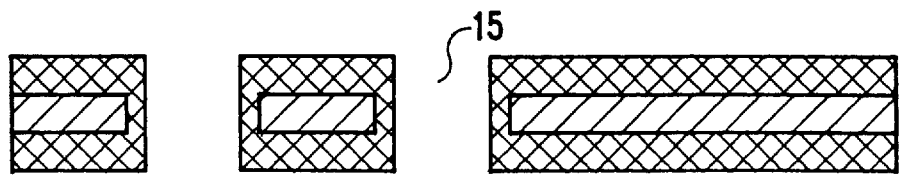

Specifically, the layered structure shown in FIG. 1d can be personalized with desired circuitization 16, 18 by either selective plating using a mask or by uniformly plating all surfaces and selectively patterning (e.g. lithographically) the plated layer by known processes to form individual conductors as desired. It should be noted that the interior of via apertures 15 remaining in FIG. 1d have been fully plated with conductor 18 which provides connections from one side of the layered structure to the other or possibly, if desired, to the metal foil layer 12 forming a power connection or core within the layered structure and that these connections in individual vias 15 are separated, as desired, from those in other via openings by patterning of the plated surface conductors.

Figure 1E:
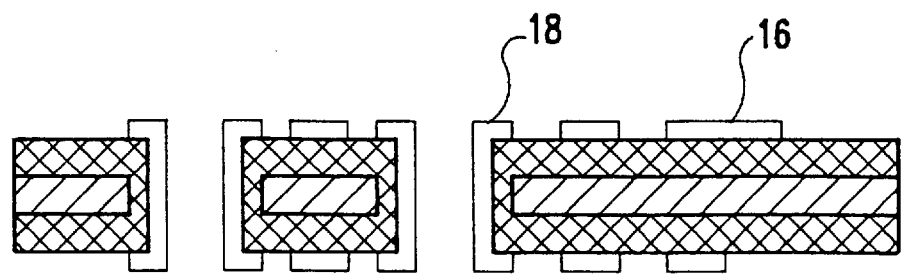

It should be further noted that all patterning is preferably done by lithographic methods and potentially at the full resolution and minimum feature size available at the current state of the art. Even though a lower resolution and larger minimum feature size may be preferable in view of the tolerance required for alignment of layered structures for lamination, such tolerances represent substantially the only design trade-off which limits size reduction to the full potential of lithographic processes. It is contemplated by the inventors that wiring densities of at least 640 in./in.$^2$ (e.g. 640 linear inches of conductor, regardless of pattern, within 1 square inch), and devices including a 0.025–0.050 mil via grid and a 0.003–0.005 mil line width/spacing can be reliably produced with good manufacturing yields on both top and bottom surfaces of the layered structure (for a total wiring density of well in excess of 1,000 in./in.$^2$ for each signal core as shown in FIG. 1e; representing a substantial increase in wiring density over previous devices fabricated by known techniques while providing improved conduction through vias and avoidance of difficulties in screening of extremely fine patterns and reliable fill of small and/or high density vias.

This substantially increased wiring density provided by the invention compares very favorably with wiring densities required by direct chip attach (DCA) or surface mount packaging which typically requires total wiring density of all layers of a multi-layer module to be on the order of several thousand in./in.$^2$ which has been accomplished in the past by increasing the number of layers in the module; the wiring density of each layer of prior devices being limited to about 100 in./in.$^2$, as noted in U.S. Pat. No. 5,129,142 to Bindra et al. and assigned to the assignee of the present invention. Since wiring having such potentially fine features is particularly appropriate to signal wiring, the layered structure will sometimes be referred to hereinafter as a signal core. However, if desired, it is to be understood that power connections made be made at appropriate dimensions in these layers as well.

Further, such lithographic methods and processes do not cause dimensional distortions (which are also limited by the dimensional stability of foil layer 12) requiring a "best fit" alignment and increased conductor pattern tolerances and do not form particulate residues which may contaminate the abutting structures when laminated together. Perhaps most importantly, the personalization circuitry formed by the copper plating is applied after all material removal has been completed and is not compromised by residues resulting from material removal, particularly to form connections between wiring on the tops and bottoms of the layered structure. As will be discussed below, reliability of formation of connections between layered structures, when several are laminated together, will also be enhanced, in accordance with the structure of the invention.

It should also be recognized that the layered construction described thus far is completely independent of any particular via pattern and personalization circuit pattern or size of lamina which may be desired or required and is compatible with all materials commonly used for such modular structures. That is, the process described above is completely generalized to the fabrication of any type of circuit module of any desired size from any appropriate material. The increased wiring density made available through this process can also be exploited by formation of redundant circuits and/or more generalized personalization patterns (in which some connections may not be used in all wiring layers in order to obtain the benefits of using fewer personalization pattern designs or used for circuit repairs, known as engineering changes (EC), as may be found to be required by testing at intermediate levels of device fabrication).

Additionally, highly reliable connections are made through the layered structure without the necessity of filling the vias. Therefore, the vias themselves remain available as features for optical alignment of all layers of the composite device immediately prior to lamination.

Many benefits of this structure include many benefits from the avoidance of drilling aside from the avoidance of contamination by the absence of drilling residues such as material particles, the potential via and wiring density can be increased because no allowance need be made for drill wander. Drill wander may affect the positional accuracy of the location where the via is formed and, in addition, can cause a larger diameter of the via at the bottom of the hole than at the side from which drilling is done. Due to the small diameter of bits and consequent flexibility thereof used for such drilling, drill wander can cause out-of-roundness and/or an increase in via dimensions of 20% or more at the surface of the layer over the size of the bit; requiring wiring and via density to be reduced to accommodate such a possibility. Drill bit wander may also compromise via filling because of the increase of via volume. Binding of particles between the bit and workpiece can also cause defects in via formation.

The avoidance of drilling also produces significant economic benefits such as the avoidance of the need for extremely fine bits which are very expensive and highly subject to breakage and the need for high precision drilling equipment including indexing tables and the like. Amortization of the costs of such bits and machinery is a significant cost factor since holes must be drilled sequentially and substantial time is required to form vias in each layer.

Therefore, to summarize the benefits of this signal core subassembly structure thus formed, higher wiring densities may be provided on each side of the layered structure than with previous technologies and this benefit is enhanced by provision of two (signal) interconnection (2S) layers on each layered structure with improved connections therebetween. Electrical shielding, dimensional stability and a potential power connection (1P) are provided by the metallic foil sheet 12 to form a composite 2S/1P subassembly. Lithographic processes provide for concurrent formation of vias with increased reliability and dimensional regularity while being less susceptible to individual malformations and irregularities of positioning while avoiding contamination of surfaces with particulate residues. Further, at this point of the construction, inspection such as by automated optical inspection and electrical testing of both layers of personalization circuitry is readily accomplished. Moreover, all adverse effects of drilling are avoided since drilling is not required.

Figure 2A:
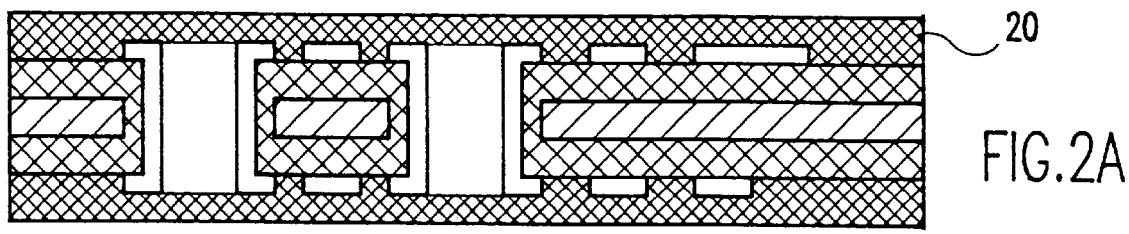
FIGS. 2A, 2B and 2C are a sequence of cross-sectional views illustrating the personalization and lamination of a plurality of 2S/1P cores in accordance with the invention.
Figure 2B:
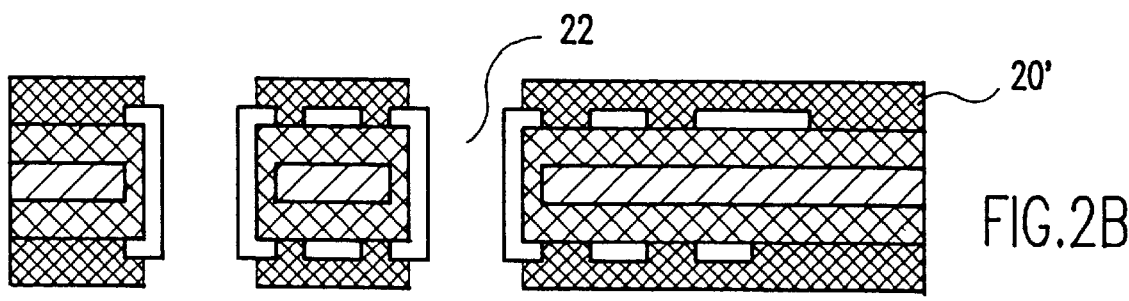

To continue the fabrication of a multi-layer module including the signal core subassemblies described above, the personalization circuitry is, in one embodiment of the invention, protected from damage and contact with other wiring patterns when the layered structure is laminated with other layered structures by the application of a dielectric layer 20, as shown in FIG. 2a, on both sides of the layered structure of FIG. 1e. Use of a photosensitive dielectric is preferred for further patterning to form openings 22 as shown in FIG. 2b in correspondence with the vias or at least selected ones thereof. It should be noted in this regard that filling of the vias with dielectric is not necessary and preferably avoided by the expedient of providing these dielectric layers in the form of a sheet, referred to as a "sticker sheet", to the layered structure. The material of this sheet 20 should be thermally deformable and bondable to other such sheets or other materials such as metal foils, as will be discussed below. Preferred materials are disclosed in U.S. Pat. No. 5,026,624. However, other materials capable of adhesiveless joining may be used. Photosensitive polyimides require additional adhesive to be applied and are thus not considered to be particularly suitable for the purpose.

Figure 2C:
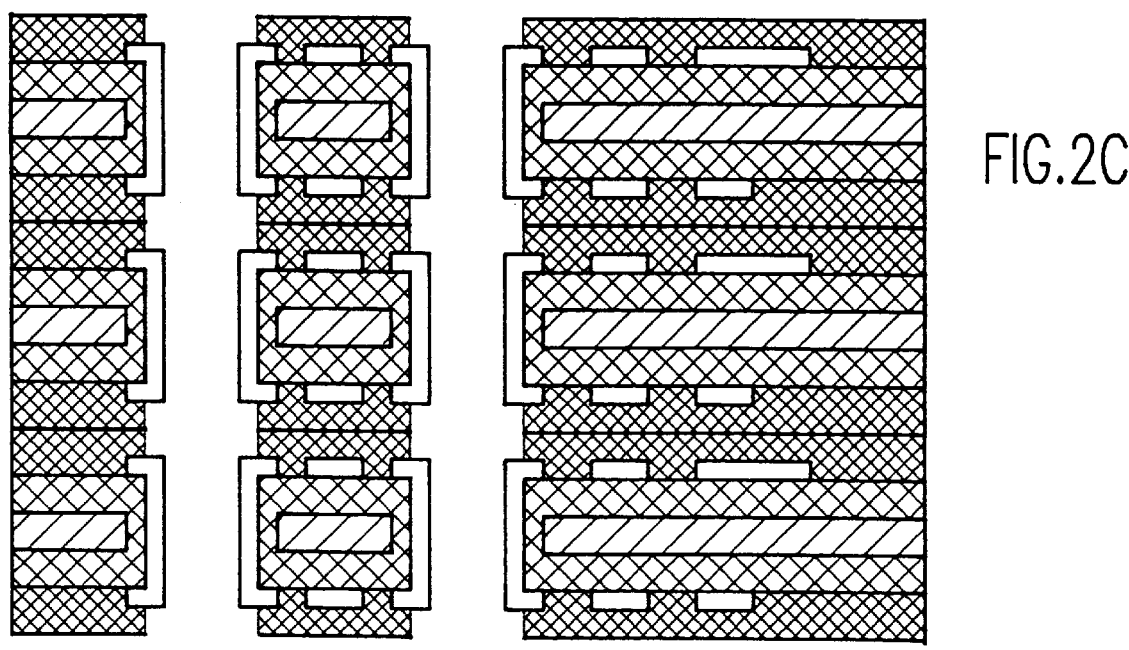

Once the dielectric or sticker sheet 20 is patterned, the vias 22 are again opened to assist in optical or other techniques for alignment with other similar layered structures and for formation of via connections. For example, as shown in FIG. 2c, three signal cores are aligned with each other and preferably glued with an adhesive material (preferably using a releasable glue) and tested. Once alignment is considered satisfactory and testing completed, heat and pressure are applied as appropriate to the material of the dielectric or sticker sheet to cause bonding of the layers to each other and to the respective layered signal core structures to form a composite structure.

Figure 3A:
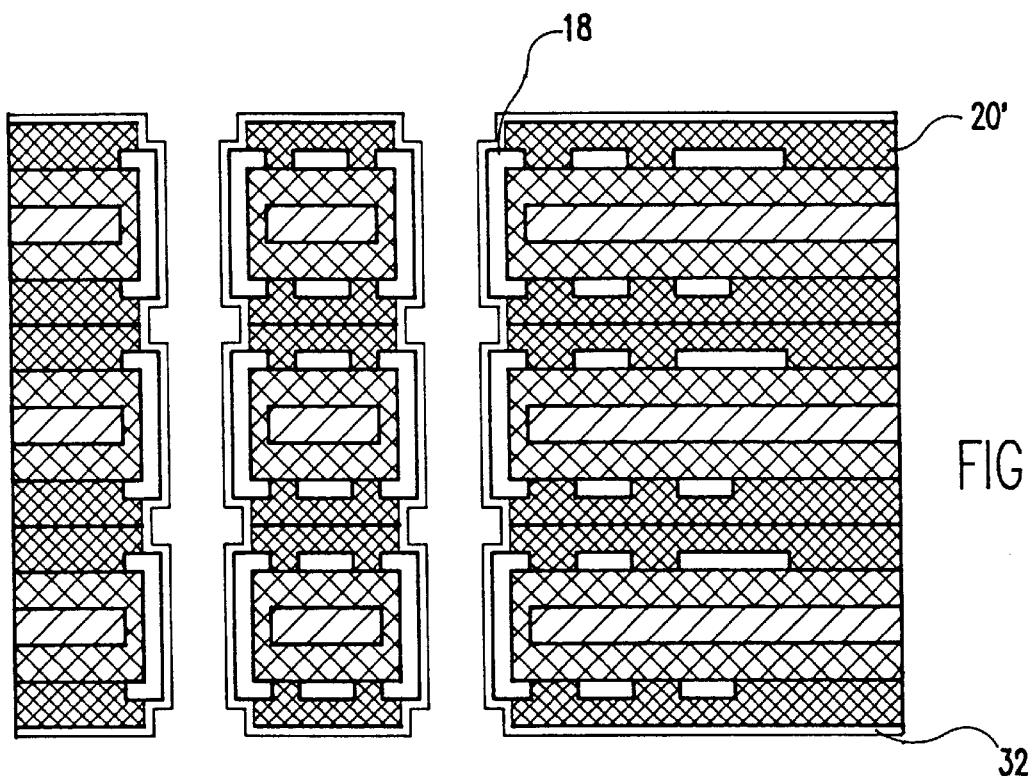
FIGS. 3A and 3B are a sequence of cross-sectional views illustrating the formation of via connections in the laminated structure of a plurality of 2S/1P cores shown in FIG. 2c in accordance with the invention.

In the laminated structure of FIG. 2c, connections have not yet been made between the conductors 18 within the vias 15. These connections are preferably made in combination with additional personalization circuitry layers as will now be described in connection with FIGS. 3a and 3b. Specifically, as shown in FIG. 3a, the laminated composite structure (which may have more or fewer adjacent signal cores or more than one group of such signal cores) is seeded to enhance the plating action with a palladium salt or the like as is well-understood by those skilled in the art and the entire structure plated with a conductor such as copper by a flash plating or electroless process or the like. This forms a layer 32 of conductor connecting all exposed via connections 18 and forms a continuous layer over exposed dielectric layers 20'. It should be understood, however, that portions of vias (i.e. at lower levels of the laminated structure of FIG. 2c) could be closed by block-out masking (e.g. of the sticker sheet 20 prior to via opening) to avoid etching at either of the steps shown at FIG. 1c or 2b to avoid reopening of a via and later connection to other layers. It should also be understood that while layer 32 is depicted as continuous, this layer potentially provides an additional signal layer since it can be patterned by lithographic and other processes in the same manner as layer 16. This possibility would generally be exploited by formation of conductors orthogonal to the conductors formed by patterning of layer 16 and would thus would be consistent in cross-sectional appearance with the depiction in FIG. 3a.

Figure 3B:
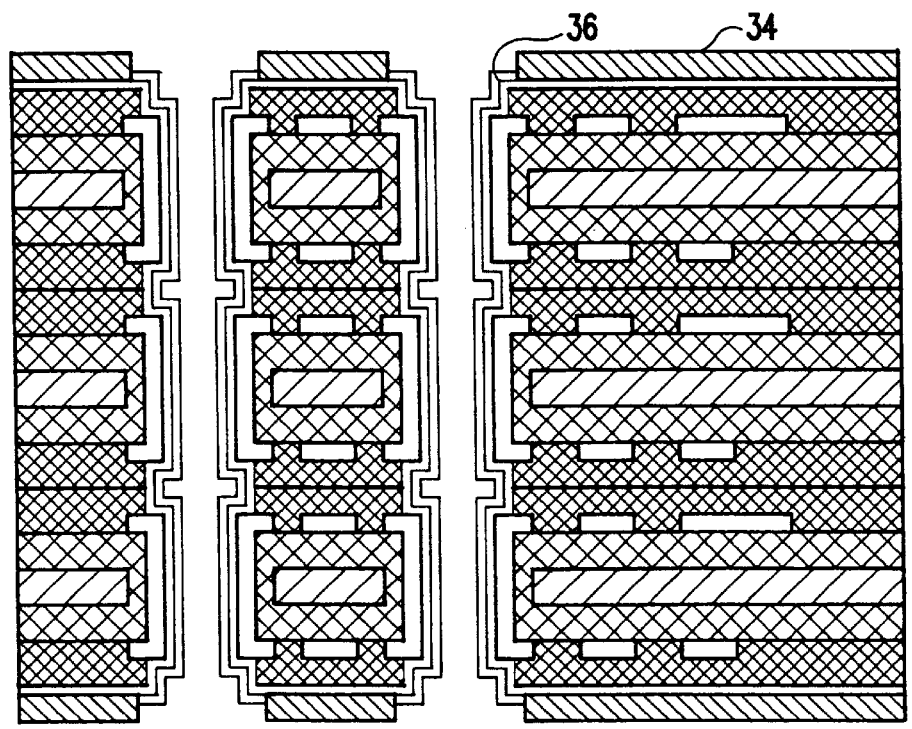

To protect this conductor layer, a further layer of dielectric 34, again preferably in the form of a photosensitive polyimide sticker sheet, is overlaid thereon, exposed, developed and patterned. Then, to further enhance the quality and reliability of the via connections and to provide further signal wiring patterns if desired, a further conductive layer 36 is selectively plated or deposited onto the exposed metal as shown in FIG. 3b.

It should be recognized that any of layers 16, 18, 32 and 36 could be composite layers (e.g. including layers of chromium, gold, and the like) to enhance adhesion, conductivity, etc. as is well-understood in the art. Alternatively, any or all of layers 18, 32 and 36 which are overlaid in the vias could be single or multiple layers of conductors or comprise a sequence of conductive materials to form a multi-layer conductor within the vias. Whatever materials or sequence of materials is used, the thickness of the conductor is substantially increased, as desired; the only limitation being that the deposition of further conductor material may occur faster near the surface of the laminated structure and could potentially close the via in a manner which leaves voids near the center of the laminated structure. If such via closure occurs, the structure will be operable and of increased reliability relative to prior modular interconnection structures but of less than the full robustness developed by the completion of the structure in the manner depicted in FIG. 4.

Specifically, since a highly conductive metallic structure has already been formed within the vias (or "plated through-holes" (PTH)), further conductive material is not required therein. Therefore, it is considered preferable to fill the remaining via or PTH volume with a resin or paste which may or may not contain materials of relatively high thermal or electrical conductivity. Suitable materials usually may be screened much in the fashion of screening conductive paste onto individual lamina of known MLM devices except that a mask need not be usedunless a further conductive pattern is being formed by the same operation on a surface thereof or is required for some other purpose. Even if such a conductive pattern is to be formed by screening on the top and/or bottom of the laminated structure of FIG. 3b, it is considered preferable to form the conductive pattern in a separate screening step which allows for any volume contraction of the paste used to fill the via openings and separate curing thereof as well as allowing the vias to be filled with a less viscous paste, enhancing the reliability of via fill, which may not be of optimum viscosity for accurate formation of the conductive pattern.

Figure 4:
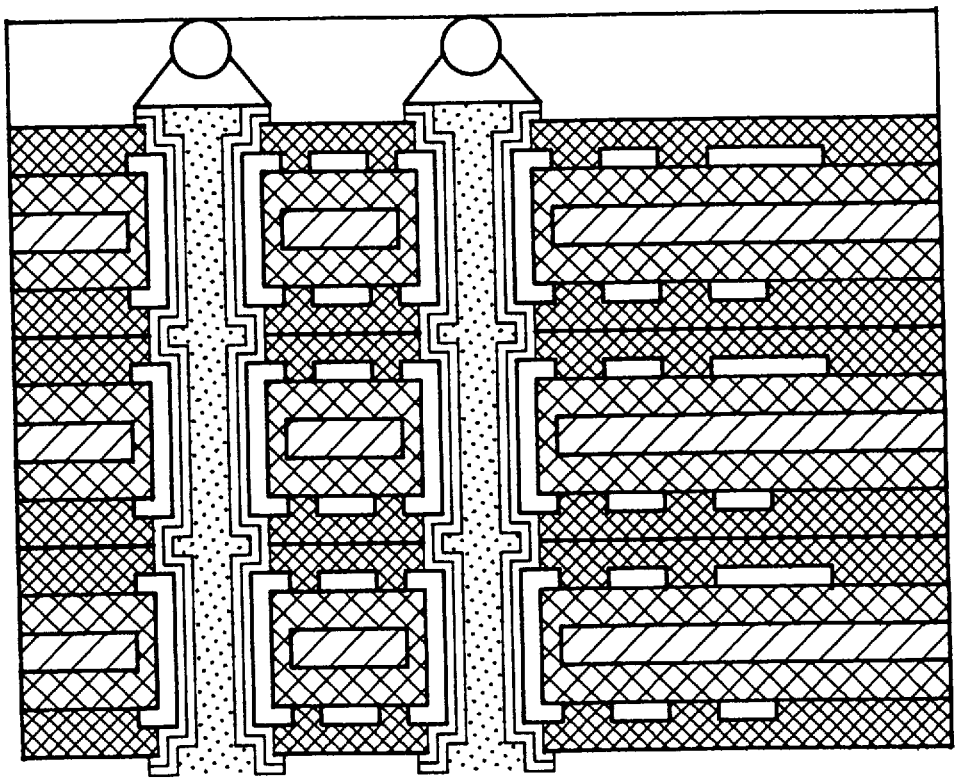
FIG. 4 is a cross-sectional view illustrating completion of via structures and the addition of connection structures for the attachment of integrated circuits to the structure of FIG. 3b.

Referring now to FIG. 4, the module is completed by applying another layer of resist, (preferably over a thin layer of copper for purposes of electroplating) which is patterned to expose the via connections. The resist layer material and the exposure and development are unimportant to the practice of the invention. However, it is desirable that the resist layer be of a thickness (generally increased from thickness otherwise customary) to define desired volumes above the via connections for the purpose of controlling the volume of solder material which can be deposited therein.

It is also desirable that the resist be of a material which is not solder-wettable for purposes of developing a desired generally conical shape of the solder deposits, as shown in FIG. 4, and reduction of the amount of copper available for solution in the solder and other refinements of the preferred solder electroplating process disclosed in detail in U.S. patent application Ser. No. 08/387,686 (Attorney's docket EN9-91-089) which is hereby fully incorporated by reference. These refinements, although preferred insofar as they may be applicable to any particular structure being fabricated, are not otherwise important to the practice of the basic principles of the invention.

These volumes formed by patterning of the resist are then substantially filled by preferably electroplating of solder therein. The particular solder alloy is not critical to the practice of the invention but the alloy should be chosen in accordance with a reflow temperature and copper solubility which is suitable for chip attachment, with or without the additional use of solder preforms such as the well-known "C4" type of solder preform. It is presently preferred that a 60/40 Sn/Pb alloy be electroplated in view of a preferred used of C4 type preforms of a preferred 97/3 Sn/Pb alloy.

Following solder plating or deposition by known techniques such as application of solder paste to the volumes formed in the resist, the resist is removed and the thin copper layer, if used, is etched, preferably by a flash etch process. One or more integrated circuit chips may then be joined to the laminated structure by known techniques and the assembly tested and encapsulated, filling the space between the chips and the module surface, into a completed package.

It is to be understood that procedures similar to those described above (often referred to collectively as top surface metallurgy) for mounting chips and other components are generally known and are not critical to the practice of the invention but are described in the interest of completeness and to convey an understanding of the features of processes which are preferred and/or compatible with the principles of the invention. Similar processes and variants thereon would also be employed on the opposite side of the module for mounting and encapsulation of the mounting sites of connections such as pins (not shown) and the like, often referred to collectively as bottom surface metallurgy, and which are similarly not critical to the practice of the invention and principles thereof.

From the foregoing, it is clear that the invention provides a modular structure and technique for forming it which exhibits the potential for greatly increased wiring density applicable to all standard and conventional materials for modular electrical devices and which is of improved reliability and robustness. The module can be manufactured at reduced expense and with improved manufacturing yield since via structures are always available for alignment and the lamina, prior to lamination, are not contaminated and do not have stresses induced therein by via formation, which is, itself, conducted with improved speed, uniformity and freedom from via malformation. The principles of the invention may be extended to any number of lamina of any dimensions and can accommodate circuit designs of theoretically unlimited complexity.

Returning now to FIG. 1d, a variation of the invention will now be discussed. The above embodiment of the invention is composed of signal cores which provide two signal wiring layers for each power wiring layer in each signal core, as shown in FIG. 1e in a so-called 2S/1P configuration. Of course numerous techniques of dividing the power conductor into two or more areas or layers will occur to those skilled in the art in view of the foregoing description. For example, two or more sheets 12 could be laminated or placed side-by-side in the same plane or both to provide additional power connections in a single signal core. However, as a practical matter, two or more signal cores will generally be required in devices where the present invention will provide more particularly significant advantages in comparison with other technologies and the required number of power connections layers will usually be less than half the number of required signal wiring layers.

However, it will be recalled that the conductive foil 10, 12 in a power core of FIG. 1d (whether or not additional wiring structure is included to form a signal core of FIG. 1e) can provide shielding between wiring layers, whether or not it is used to carry power. Further, as a practical matter, power cores may be used in place of individual or pairs of sticker sheets 20 and, due to the stiffness provided by the foil, are far easier to handle and manipulate, either manually or with automated equipment, than individual sticker sheets 20.

However, when a power core is to be used as a sticker sheet it is preferably only partially cured prior to lamination. Specifically, when a power core is to be used as a core for formation of a signal core, as described above, it is preferably patterned with a full ultra-violet exposure of about 1.0 Joules and fully developed. Then it is preferably subjected to a further, more intense exposure of about 3–6 Joules, referred to as a "UV bump" to exhaust any further sensitivity to UV radiation. The power core is then washed and cured at 150° C.–200° C. for 1–2 hours. This amount of cure minimizes dimensional changes during lamination at similar temperatures and times when the stack of lamina and subassemblies of lamina are also subjected to preferred pressures in the range of 300–600 psi.

In contrast, when the power core is to be used as a sticker sheet, patterning is done with approximately 50% less exposure and the exposed sheets are underdeveloped by a low activity developer to reduce the likelihood of damage to the insulator materials. The power core is then washed in warm water for 10–30 minutes at a temperature of 120° F. to 200° F. and, without being subjected to an "UV bump" baked for 2–3 hours at a reduced temperature of 75° C.–120° C. which is sufficient to drive off virtually all moisture but only achieve a partial cure to a so-called B-stage material. The remainder of the cure is accomplished during the lamination process when the adhesive and thermoplastic and adhesive properties of the partially cured material will be relied upon to achieve bonding. Dimensional change of power cores used as sticker sheets during lamination is relatively less critical than when signal wiring layers are applied thereto and the relative deformability of the partially cured power core also serves to prevent damage to the wiring layers to which it is adhered during lamination.

Additionally, a power core or a portion thereof as may be determined by the patterning 11 applied to foil 10 may be used to form a robust, low resistance power connection laterally within the module at an intermediate layer thereof where power access entirely in a direction orthogonal to the plane of the lamina might not otherwise be feasible, consistent with high reliability. Also, in circuits where it might be otherwise possible to use several identical signal cores but for the need to make a particular power connection (and a different transverse dimension of via or other variation of via structure might be necessary) it may be desirable and highly economical, instead, to use two identical power cores and independently provide an additional power connection layer.

Figure 5:
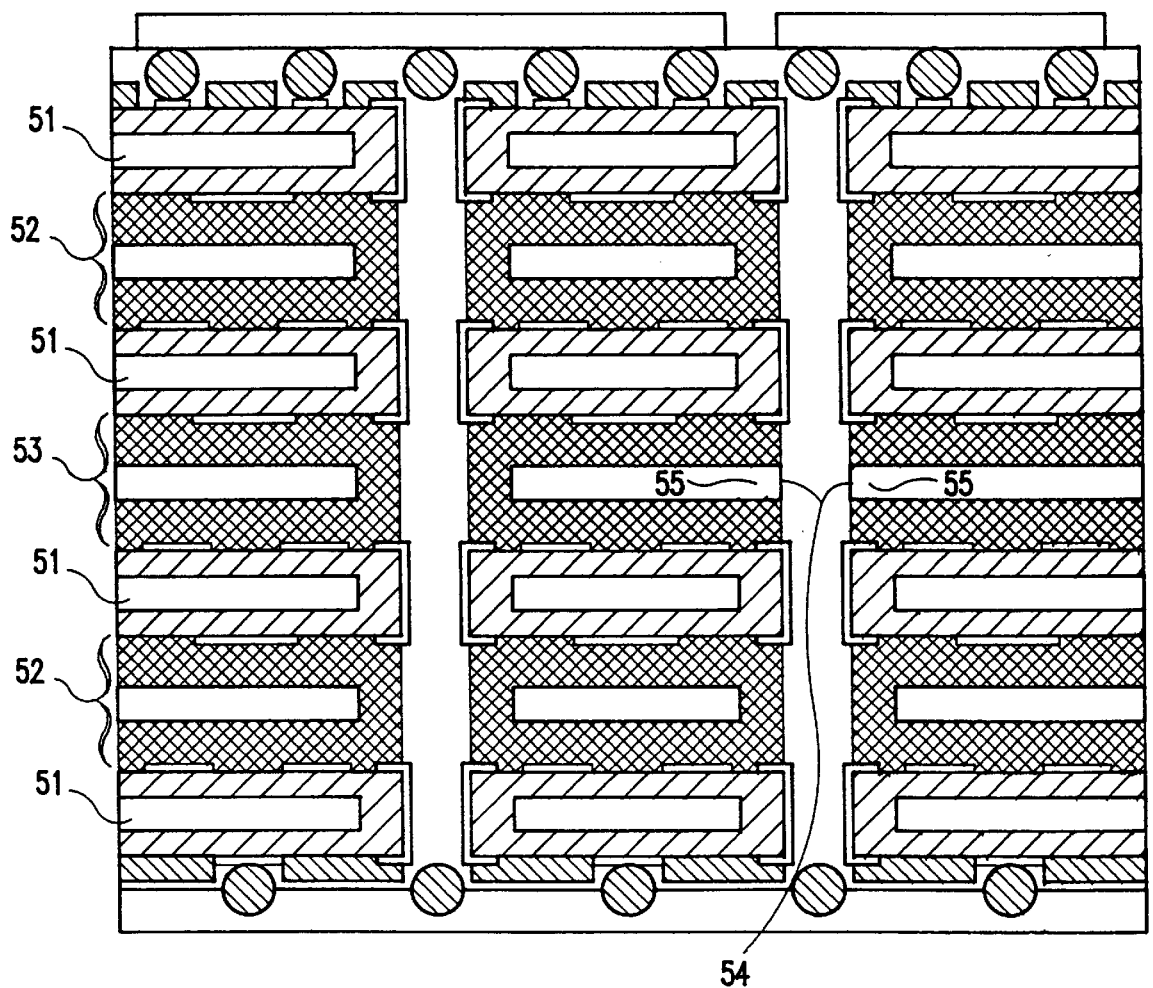
FIG. 5 is a cross-sectional view illustrating lamination of four power cores in accordance with an example of the invention.

To answer these possible needs while increasing the ease with which an electrical connection module can be fabricated in accordance with the invention, the variation of the invention shown in FIG. 5 illustrates the lamination of four power cores 51, as individually shown in FIG. 1e and which may or may not all be identical or of unique personalization wiring designs, laminated together with three intervening power cores 52, 53 as individually shown in FIG. 1d and which may also be either identical (e.g. if only shielding is to be provided or simply as a matter of using sticker sheets which are easier to handle than single sticker sheet 20) or, as illustrated, different by reason of selected vias being differently sized (e.g. at 54 of power core 53) in order to provide a power connection to a via. It should be noted that at least one via in each power core should be differently sized or insulator layer 14 differently patterned (e.g. as at 55) in each power core so that the metallic foil layer 12 is exposed within at least one via at least for the purpose of connection to a reference voltage in order to provide a shielding function. All via structures are preferably the same type of structures or variations thereof as described above with reference to 3a and 3b and chip and bottom surface metallurgy, including pins (not shown) are the same as that described above with reference to FIG. 4 and variations thereof.

As will be evident to those skilled in the art in view of the above description, any combination of sticker sheets 20 and power cores 52, 53 can be used between various lamina included within a module or between any pair of adjacent lamina therein. For example, it may be found desirable in a particular manufacturing environment to apply a sticker sheet 20 or a power core 52, 53 on the bottom (or top) of the signal module and a power core 52, 53 on the top (or bottom) of the signal module at the process step shown at FIGS. 2a or 2b for any or all of the signal modules to be included in the completed module. While an increased thickness and increase in via connection length would result, the integrity of the via connections would not be compromised in view of the improved structure provided by the invention, shielding would then be provided between all personalization circuit wiring layers and handling of materials would be facilitated. Additionally, if two wiring cores (or an additional foil sheet 12 and sticker sheet 20 together with a power core 53) were provided between a pair of power cores or on the top or bottom of the module, all power connections could be simultaneously made at essentially a single level of the module. Thus, any sequence or number of power cores 52, 53, signal cores 51, sticker sheets 20 and foil layers 12 can be used as needed or desired in a circuit module design and should be considered as falling within the scope of the invention. For example and by extension, in accordance with the invention, any number of the laminated structures of FIGS. 2c, 3a or 3b could be laminated together with any number of the structures shown in FIG. 5, each having any desired number of lamina, in any sequence, as a design may require or advantageously utilize.

Additionally, by block-out masking or other relatively low resolution and easily alignable technique or the like, any via connection may be terminated or interrupted at the level of any lamina in the module by simply avoiding opening of the via on either side thereof. Of course, this may require the completion of vias structures through the point of resin or paste filling as shown in FIG. 4 prior to lamination with one or more signal cores and/or power cores. However, this will not normally be the case and an exemplary cross-section of a completed device is schematically shown in cross-section in FIG. 6.

Figure 6:
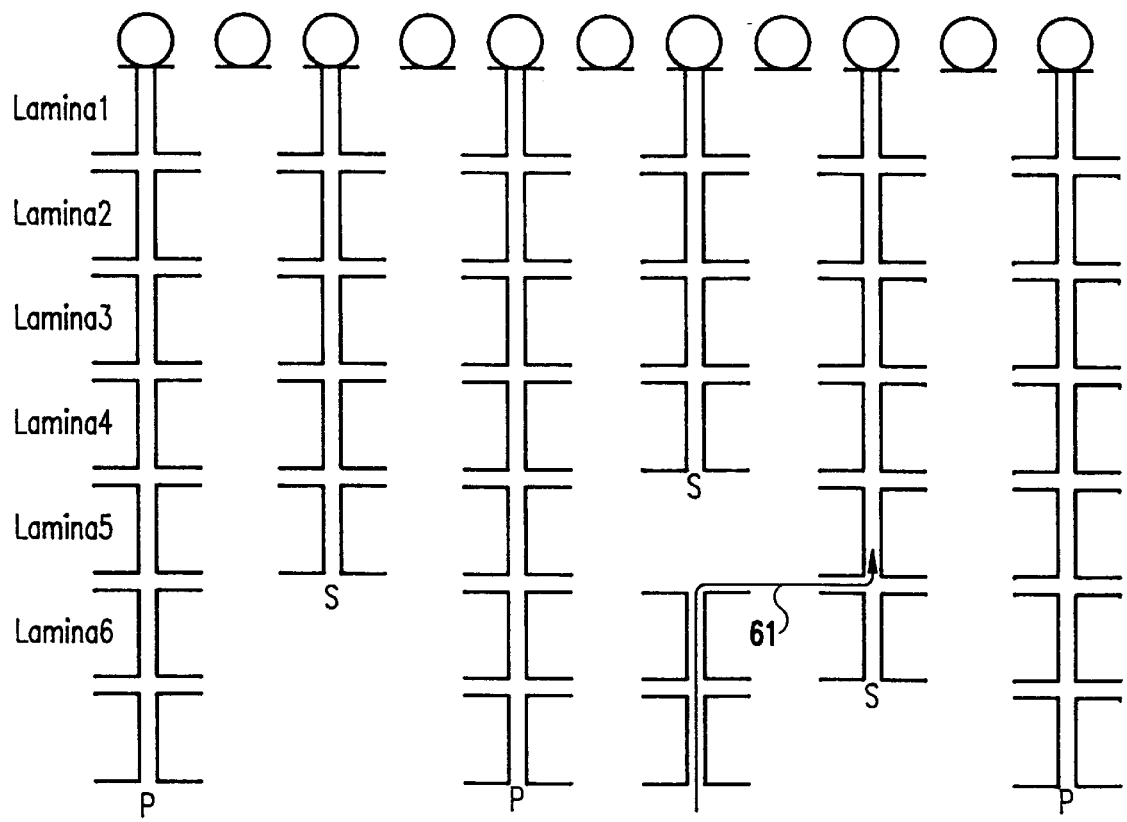
FIG. 6 is a schematic illustration of an exemplary completed device in accordance with the invention.

In the cross-section shown in FIG. 6, clearance holes (the interior of vias) are periodically formed from the upper surface to the bottom of the device. Power connections will generally be formed through the entire device. Of the three connections shown, one will generally be dedicated for connecting a reference voltage to all foil sheets 12, whether or not formed in power cores, which do not carry power but are used, if at all (recalling that a power core provides ease of handling due to increased stiffness and may be used for that reason, independent of any functionality), for shielding. The others two (or more) also extend through the entire device (and, hence, all are available for alignment purposes throughout the fabrication process) and are used to power the integrated circuits which are mounted on the module. Power connections can be made to the vias at any level of the laminated module, as desired, by patterns of personalization wiring.

Signal connection vias will usually extend less than the full thickness of the module but it is usual for signal vias to extend from both surfaces of the module and to be connected to other layers and vias at intermediate levels of the module such as depicted by arrow 61. Even though a via connection is closed at the interface of lamina 5 with each of lamina 4 and 6 a robust via connection can be formed by plating in the via openings from the top and bottom of the laminated structure. Even in lamina 5, the same via can be used for connections between the top and bottom personalization wiring on a signal core although increased robustness could be derived from further plating and filling with resin or paste.

It should also be recognized that any or all of the lamina shown in FIG. 6 may be laminated structures or subassemblies such as those shown in FIGS. 3a, 3b and 5. In this case, completion of at least selected via structures as shown in FIG. 4 by additional plating and filling is deemed preferable and, in any case, plating may be needed, in accordance with a particular design, to make desired connections within that laminated subassembly.

In view of the foregoing, a system of structures and device fabrication methodologies has been provided which provide both a structure for supporting and interconnecting one or more integrated circuit chips or other devices of increased robustness and method of fabricating it with increased ease, economy and manufacturing yield and reduced number of manufacturing steps of reduced complexity and expense as well as increased speed and uniformity of via openings and increased reliability of connections made therethrough. The structure and methodology of the invention also provide increased ease and accuracy of alignment for lamination in multi-layer modular structures, including rigid or flexible printed circuit structures with high repeatability and increased wiring density. The methodology of the invention is applicable to all commonly used materials including but not limited to ceramics polyimides, epoxy structures and all common metallurgies and is preferably practiced with electroplating methods for applying solder.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A structure for inclusion in a multi-layer electrical interconnection structure including
   at least two interconneted signal cores, each of said at least two signal cores comprising
      a metallic foil having apertures formed therein,
      a first insulator material formed on surfaces of said metallic foil including within an interior of said aperture, first portions of said insulator being removed lithographically thereby exposing said metallic foil within at least one of said apertures, and second portions of said first insulator being partially removed reexposing at least one other of said apertures while said first insulator material remains on said metallic foil surface in said at least one other of said apertures, said first metallic foil and said first insulator material forming a first interconnection structure, and
      a first pattern of conductive material formed on said first insulator material and extending through at least one said aperture of said first insulator material
   each of said at least two signal cores being stacked on one another such that said apertures of each of said metallic foil are aligned,
   an insulative material between each of said stacked signal cores, said insulative material having apertures aligned with said apertures of said metallic foil forming each of said signal cores,
   a layer of conductive material formed over said conductive material formed on each of said signal cores and extending onto portions of said stacked signal cores and insulative material, thereby forming a continuous layer of conductive material, and
   a second layer of conductive material formed over said first layer of conductive material.

2. A structure as recited in claim 1, wherein said second insulator material is a sheet of insulative material.

3. A structure as recited in claim 2, wherein said sheet of insulative material is a photosensitive material.

4. A structure as recited in claim 2, wherein said sheet of insulative material is affixed over said pattern of conductive material with an adhesive material.

5. A structure as recited in claim 2, wherein said sheet of insulative material is bonded over said pattern of conductive material.

6. A structure as recited in claim 1, wherein said metallic foil is copper.

7. An electrical interconnection structure including at least one signal core comprising:
   at least two signal cores, each of said at least two signal cores comprising,
      a metallic foil having apertures formed therein,
      a first insulator material formed on surfaces of said metallic foil including within an interior of said apertures, first portions of said insulator being removed lithographically thereby exposing said metallic foil within at least one of said apertures, and second portions of said first insulator material being partially removed reexposing at least one other of said apertures while said first insulator material remains on said metallic foil surface in said at least one other of said apertures,
      a first pattern of conductive material formed on said first insulator material and said conductive material extending through at least one said aperture, wherein said first metallic foil, said first insulator material and said first pattern of conductive material form a first signal core,
   each of said at least two signal cores being stacked on one another such that said apertures of each of said metallic foil are aligned,
   at least one layer of insulative material between said stacked signal cores, wherein said apertures of said metallic foil forming a portion of said signal cores are aligned,
   a first continuous layer of conductive material formed over said pattern of conductive material and portions of said stacked signal cores, and
   a second continuous layer of conductive material formed over said first continuous layer of said conductive material.

8. A structure as recited in claim 7, further including at least one power core between a pair of said at least two signal cores, said power core comprising
   a metallic foil having apertures formed therein, an insulator formed on surfaces of said metallic foil, first regions of said insulator removed exposing said metallic foil within at least one of said apertures and second regions of said insulator being removed to reexpose at least on other of said apertures while remaining on said metallic foil surface in said at least one other of said apertures.

9. A structure as recited in claim 7, further including a resin fill material filling said aperture having said two layers of conductive material formed over a portion of said conductive pattern extending through said at least one aperture.

10. A structure as recited in claim 7, further including
   an insulative material formed over said first continuous layer of said conductive material and contacting an end of said second continuous layer of conducive material.

11. A method of making an electrical interconnection structure including the steps of:

forming apertures in a metallic foil, and applying a first insulator material on surfaces of said metallic foil effective to encapsulate said metallic foil within said first insulator material, wherein said first insulator material is photosensitive and portions of said first insulator material extend through said apertures to cover portions of said metallic foil which define said apertures, lithographically exposing said first insulator material to radiation energy and then developing said first insulator material effective to selectively remove portions of said first insulator material where located within at least one of said apertures effective to expose said metallic foil therein, and retaining second portions of said first insulator material on said metallic foil in at least one other of said apertures while reexposing at least one other of said apertures, selectively patterning conductive material on said first insulator material and extending through at least one said aperture of said first insulator material, thereby forming a signal core forming at least a second signal core by repeating the above steps stacking said first and second signal core such that an insulative material is placed between each signal core, and apertures of said insulative material and each signal core are aligned, plating said conductive material and portions of each signal core with a conductor layer, thereby forming a continuous conductive layer connecting said conductive material of each signal core, and plating said conductive layer with a second conductive layer.

12. A structure as recited in claim 2, further including a second insulator material over said pattern of conductive material and having at least one aperture located at a location of an aperture in said metallic foil.

13. A method as recited in claim 11, further including the step of partially curing said power core to a B-stage material.

14. A method as recited in claim 13, wherein said step of partially curing said power core includes the substeps of exposing said power core at an exposure equal to or less than 500 mJoules, partially developing said power core, washing said power core in water in the temperature range of 75° F.–200° F. and baking said power core for two to the three hours at a temperature in the range of 75° C.–120° C.

15. A method as recited in claim 11, including the further step of substantially fully curing said power core.

16. A method as recited in claim 11, including the further step of forming a conductive pattern on a surface of said signal core and including metal extending through at least one aperture.

17. A method as recited in claim 16, including the further steps of applying a second insulator material over said conductive pattern.

18. A method as recited in claim 17, wherein at least one of said first insulator material and said second insulator material is applied in the form of a sheet.

19. A method as recited in claim 18, including the further step of patterning said sheet to expose metal in said apertures.

20. A method as recited in claim 16, including the further steps of attaching a power core over said conductive pattern formed on said insulator.

21. A method as recited in claim 19, including the further step of laminating said signal cores with at least one further signal core second material.

22. A method as recited in claim 21, including the further step of forming at least one metallic layer over exposed metal and insulator in at least one said aperture.

23. A method as recited in claim 22, including the further step of filling a remainder of said at least one aperture with a resin material.

24. A method as recited in claim 17, including the further step of laminating said signal core with at least one further signal core with at least one power core therebetween.

25. A method as recited in claim 24, including the further step of forming at least one metallic layer over exposed metal and insulator in at least one said aperture.

26. A method as recited in claim 25, including the further step of filling a remainder of said at least one aperture with a resin material.

27. A method as recited in claim 11, wherein said photosensitive polymer comprises a photosensitive polyimide.

28. A method as recited in claimed 11, wherein said applying includes laminating said first insulator material to said metallic foil.

29. A method as recited in claim 11, wherein said radiation energy is selected from the group consisting of light, X-rays and electron beam.

* * * * *